United States Patent
Hsieh et al.

(10) Patent No.: US 10,749,091 B2
(45) Date of Patent: Aug. 18, 2020

(54) CHIP PACKAGE AND CHIP THEREOF

(71) Applicant: CHIPBOND TECHNOLOGY CORPORATION, Hsinchu (TW)

(72) Inventors: Chin-Tang Hsieh, Kaohsiung (TW); Cheng-Hung Shih, Changhua County (TW)

(73) Assignee: CHIPBOND TECHNOLOGY CORPORATION, Hsinchu (TW)

(*) Notice: Subject to any disclaimer, the term of this patent is extended or adjusted under 35 U.S.C. 154(b) by 0 days.

(21) Appl. No.: 16/260,528

(22) Filed: Jan. 29, 2019

(65) Prior Publication Data
US 2020/0091385 A1 Mar. 19, 2020

(30) Foreign Application Priority Data
Sep. 14, 2018 (TW) .............................. 107132548 A

(51) Int. Cl.
*H01L 33/62* (2010.01)
*H01L 33/38* (2010.01)

(52) U.S. Cl.
CPC .............. *H01L 33/62* (2013.01); *H01L 33/38* (2013.01)

(58) Field of Classification Search
CPC .................................................. H01L 2224/13
See application file for complete search history.

(56) References Cited

U.S. PATENT DOCUMENTS

| 6,083,666 | A | 7/2000 | Kim | |
| 2002/0084517 | A1* | 7/2002 | Solo De Zaldivar | H01L 23/4828 257/668 |
| 2016/0351531 | A1* | 12/2016 | Saruyama | H01L 24/13 |

FOREIGN PATENT DOCUMENTS

| EP | 1093160 | A2 | 4/2001 |
| EP | 2960312 | A1 | 12/2015 |
| JP | 2004-158701 | A | 6/2004 |
| JP | 2004-214374 | A | 7/2004 |
| JP | 2005-72202 | A | 3/2005 |
| JP | 2007-067134 | A | 3/2007 |
| JP | 2010-027847 | A | 2/2010 |
| JP | 2013-82784 | A | 5/2013 |
| JP | 2014-179569 | A | 9/2014 |
| JP | 2015-207737 | A | 11/2015 |
| JP | 2017-004715 | A | 1/2017 |
| JP | 2017-183664 | A | 10/2017 |

(Continued)

OTHER PUBLICATIONS

European Search Report dated Jul. 9, 2019 for European Patent Application No. 19154965.8, 10 pages.

(Continued)

*Primary Examiner* — Thao P Le

(74) *Attorney, Agent, or Firm* — Demian K. Jackson; Jackson IPG PLLC

(57) ABSTRACT

A microchip is electrically connected to a substrate to become a chip package, preferably for LED. A chip of the package includes a body and at least one electrode which is disposed and exposed on a surface of the body. The electrode includes a confining groove and a confining wall. The confining wall is peripherally located around the confining groove and provided to confine at least one conductive particle of an adhesive in the confining groove. The electrode of the chip is electrically connected to a bonding pad of a substrate via the conductive particle confined in the confining groove.

19 Claims, 4 Drawing Sheets

(56) References Cited

FOREIGN PATENT DOCUMENTS

| KR | 10-2010-0133064 A | 12/2010 |
|----|-------------------|---------|
| KR | 10-2016-0115918 A | 10/2016 |
| TW | 525252 | 3/2003 |

OTHER PUBLICATIONS

Taiwanese Office Action dated Nov. 26, 2018 for Taiwanese Patent Application No. 107132548, 8 pages.
Japanese Office Action dated Jan. 22, 2020 for Japanese Patent Application No. 2019-010249, 7 pages.
Korean Office Action dated May 22, 2020 for Korean Patent Application No. 10-2019-0009206, 7 pages.

* cited by examiner

CHIP PACKAGE AND CHIP THEREOF

FIELD OF THE INVENTION

This invention relates to a chip package, and more particularly relates to a package for micro LED.

BACKGROUND OF THE INVENTION

In conventional technique, a chip is electrically connected to a substrate by using a conductive adhesive having conductive particles. However, the smaller the chip, the smaller the bonding area of electrodes on the chip.

During bonding of the chip to the substrate, resin in the heated conductive adhesive is flowable such that the conductive particles may flow with the resin.

If the conductive particles flowing with the resin are not confined between an electrode of the chip and a bonding pad of the substrate result from the bonding area of the electrodes on the chip is reduced, the chip is unable to be electrically connected to the substrate via the conductive particles after solidifying the resin. Especially, if the chip is a micro LED, the electrodes on the LED are more difficult to be electrically connected to the substrate.

SUMMARY

A chip package and its chip of the present invention are used for electrical connection of the microchip, and more particularly for electrical connection of micro LED.

One object of the present invention is to provide a chip package including a substrate, a chip and an adhesive. The chip includes a body and a first electrode which is disposed and exposed on a surface of the body. The first electrode includes a first confining groove and a first confining wall. The first confining wall is peripherally located around the first confining groove and has a first height. The adhesive is disposed between the substrate and the chip, and at least one first conductive particle of the adhesive is confined in the first confining groove by the first confining wall. The first height of the first confining wall is not higher than a diameter of the first conductive particle such that the first electrode of the chip is electrically connected to a first bonding pad of the substrate via the first conductive particle in the first confining groove.

Another object of the present invention is to provide a chip including a body and a first electrode. The first electrode is disposed and exposed on a surface of the body and includes a first confining groove and a first confining wall. The first confining wall is peripherally located around the first confining groove and has a first height. And the first confining wall is provided to confine at least one conductive particle of an adhesive in the first confining groove. The first height of the first confining wall is not higher than a diameter of the conductive particle.

Another object of the present invention is to provide a chip including a body and an electrode. The electrode is exposed on a surface of the body and includes a confining groove and a confining wall. The confining wall is peripherally located around the confining groove and provided to confine at least one conductive particle in the confining groove.

The present invention utilizes the first confining wall of the first electrode to confine at least one conductive particle of the adhesive in the first confining groove. For this reason, the first conductive particle is unable to be moved with the adhesive when bonding the chip to the substrate, and the first electrode of the chip is able to be electrically connected to the first bonding pad of the substrate via the first conductive particle in the first confining groove. The present invention can avoid the electrical connection failure between the chip and the substrate, such as to facilitate electrical connection of micro LED.

DETAILED DESCRIPTION OF THE INVENTION

Figure 1:
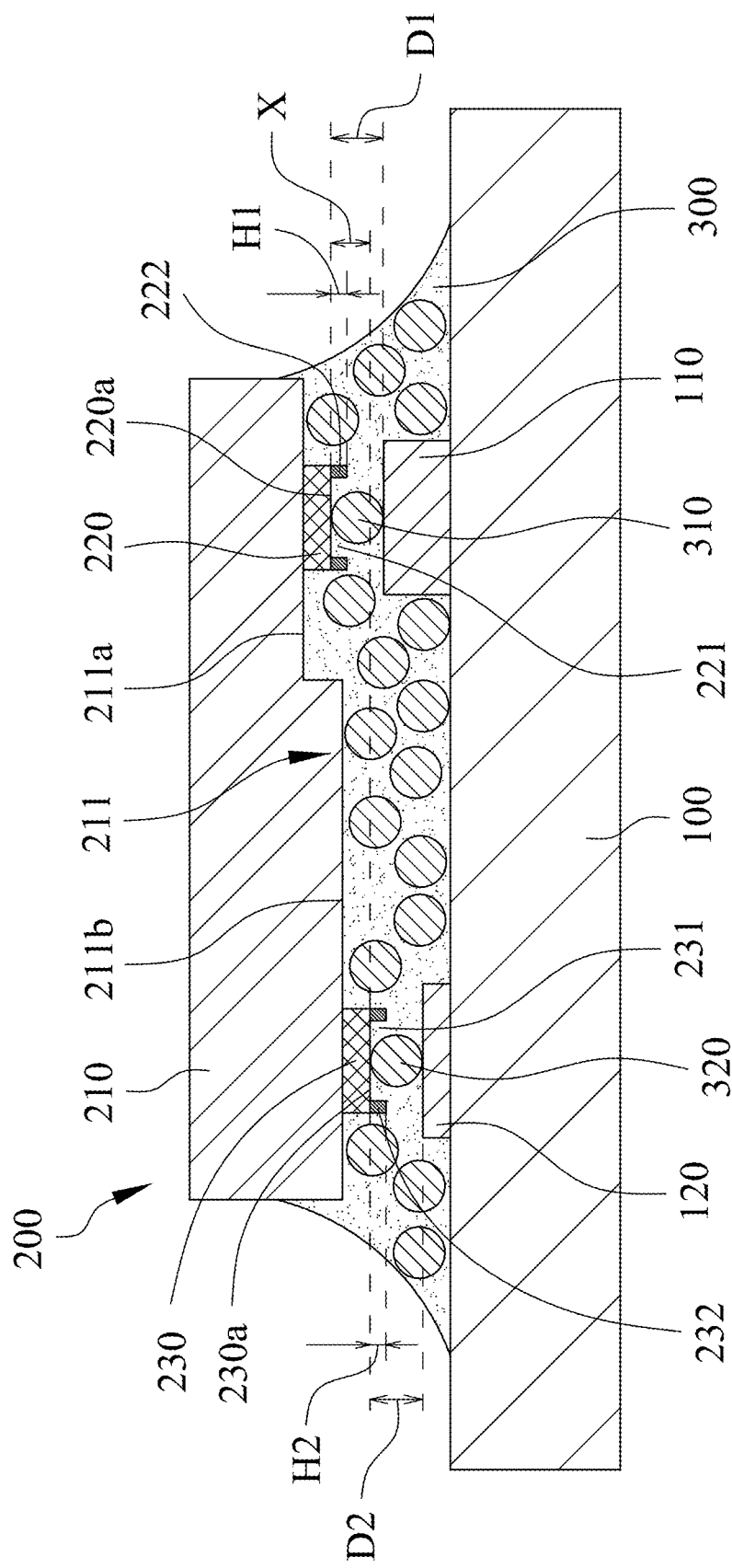
FIG. 1 is a cross-section view diagram illustrating a chip package in accordance with one embodiment of the present invention.

With reference to FIG. 1, a chip package of the present invention includes a substrate 100, a chip 200 and an adhesive 300. The chip 200 is, but not limit to, a LED chip.

Figure 2:
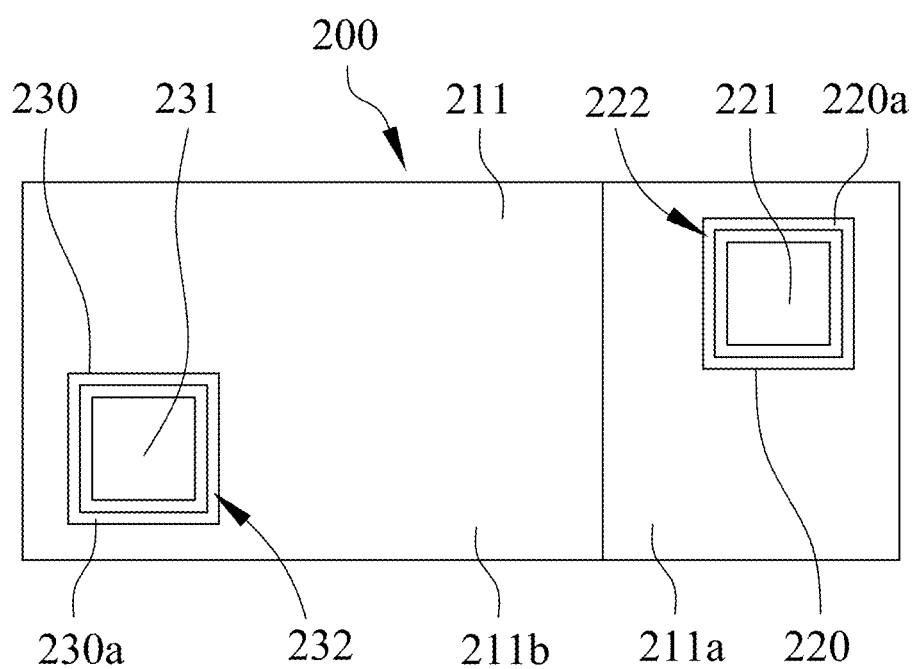
FIG. 2 is a bottom view diagram illustrating a chip in accordance with one embodiment of the present invention.

With reference to FIGS. 1 and 2, the substrate 100 includes a first bonding pad 110 and a second bonding pad 120, and the chip 200 includes a body 210, a first electrode 220 and a second electrode 230. The first electrode 220 and the second electrode 230 are disposed and exposed on a surface 211 of the body 210. The first electrode 220 includes a first exposed surface 220*a*, a first confining groove 221 and a first confining wall 222 which is peripherally located around the first confining groove 221. The second electrode 230 includes a second exposed surface 230*a*, a second confining groove 231 and a second confining wall 232 which is peripherally located around the second confining groove 231.

With reference to FIGS. 1 and 2, the first confining wall 222 and the second confining wall 232 may be made of polymer material, metal material or non-metal material. If the material of the first confining wall 222 and the second confining wall 232 is same as the material of the first electrode 220 and the second electrode 230, all of them can be formed by etching a metal layer. Conversely, if the material of the first confining wall 222 and the second confining wall 232 is different to the material of the first electrode 220 and the second electrode 230, the first confining wall 222 and the second confining wall 232 may be formed by plating or printing before or after forming the first electrode 220 and the second electrode 230 by etching a metal layer. Besides, the first confining wall 222 and the second confining wall 232 may be formed by plating with a patterned photoresist.

With reference to FIGS. 1 and 2, there is a higher surface area 211*a* and a lower surface area 211*b* on the surface 211. The first electrode 220 and the second electrode 230 are disposed on the higher surface area 211*a* and the lower surface area 211*b*, respectively. A height difference X between the first exposed surface 220*a* of the first electrode 220 and the second exposed surface 230*a* of the second electrode 230 is between 0 and 8 μm or between 0.1 and 8 μm.

With reference to FIGS. 1 and 2, the first confining wall 222 is located on the first exposed surface 220*a* of the first electrode 220 and has a first height H1. The second confining wall 232 is located on the second exposed surface 230a of the second electrode 230 and has a second height H2.

Figure 3:
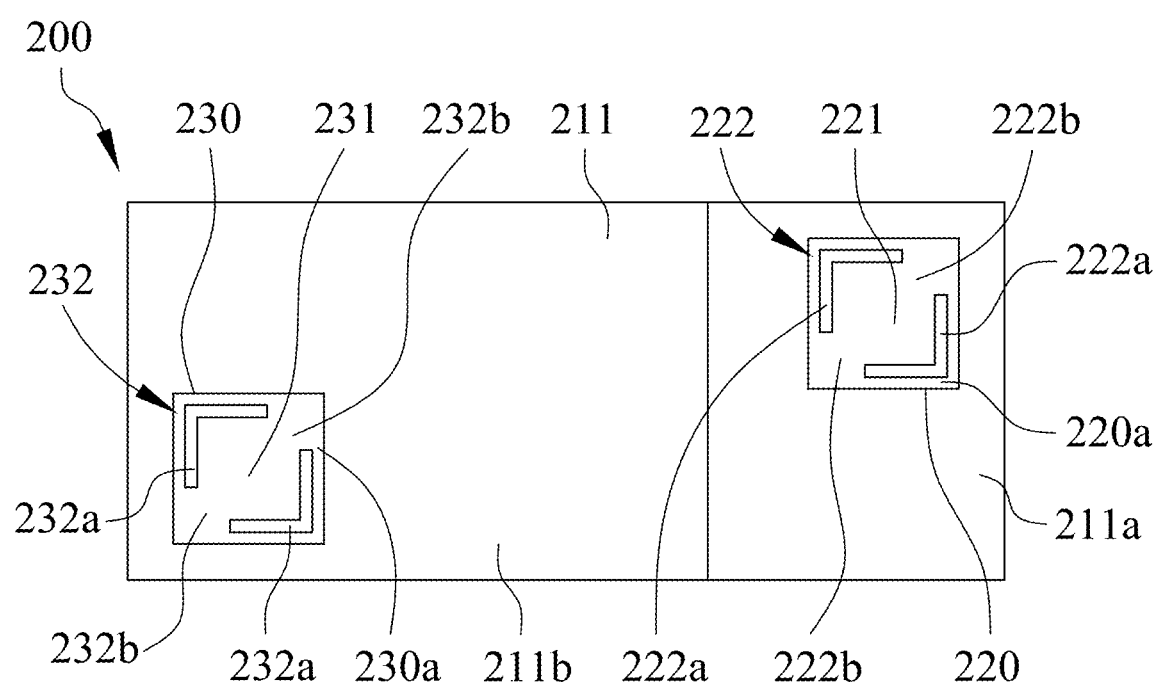
FIG. 3 is a bottom view diagram illustrating a chip in accordance with one embodiment of the present invention.

With reference to FIG. 3, in another embodiment, the first confining wall 222 includes a plurality of first ribs 222a peripherally located around the first confining groove 221, and the second confining wall 232 includes a plurality of second ribs 232a peripherally located around the second confining groove 231. There is a first gap 222b between the adjacent first ribs 222a and a second gap 232b between the adjacent second ribs 232a.

Figure 4:
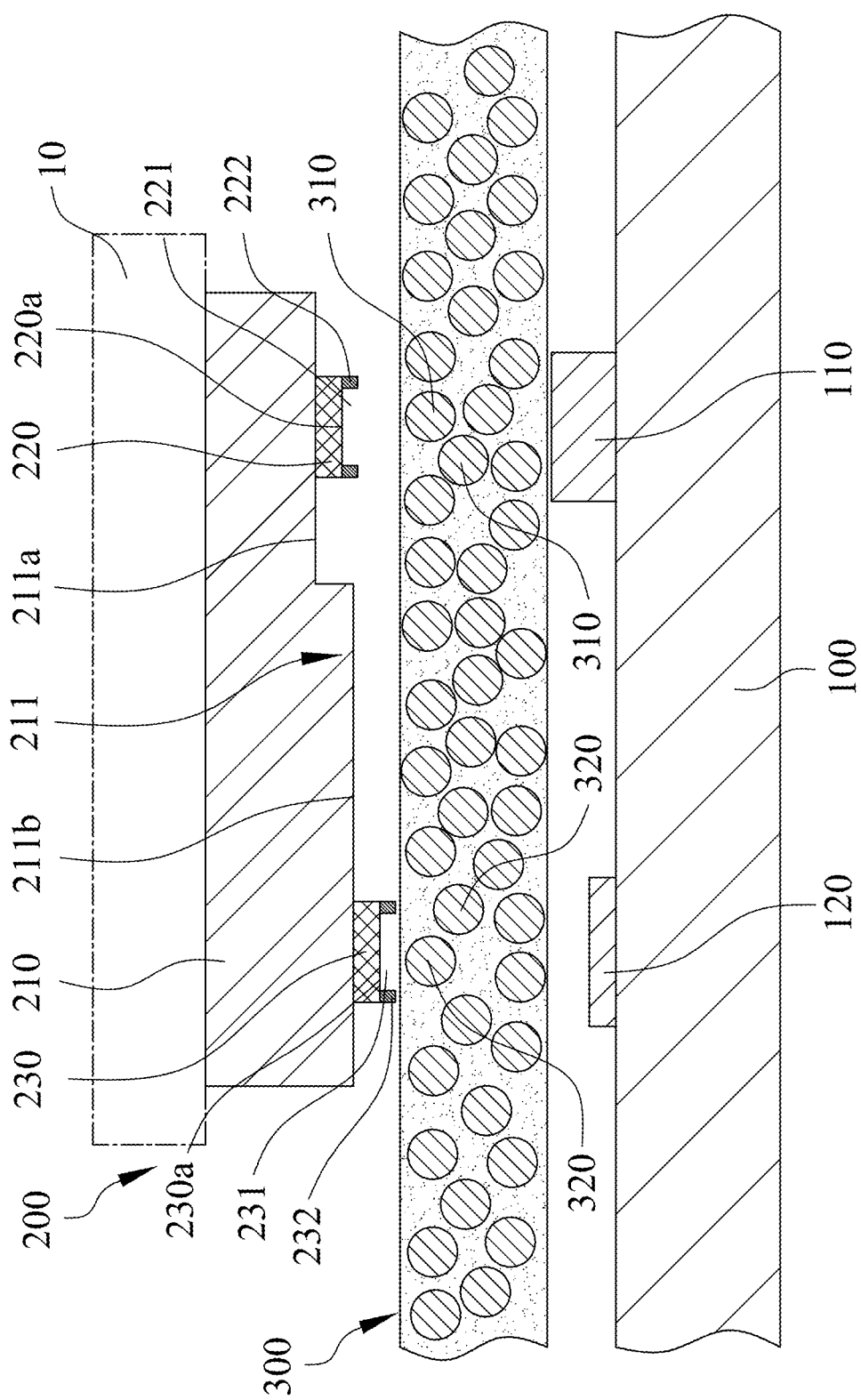
FIG. 4 is a cross-section view diagram illustrating a chip and a substrate before bonding in accordance with one embodiment of the present invention.

With reference to FIGS. 1 and 4, the adhesive 300 is placed between the substrate 100 and the chip 200. In this embodiment, the adhesive 300 is anisotropic conductive film (ACF) which consists of resin and conductive particles.

With reference to FIG. 4, the adhesive 300 of this embodiment is a thin film before bonding the chip 200 to the substrate 100. During the thermal compression bonding of the chip 200 and the substrate 100 by using a tool 10, the adhesive 300 is pressed by the chip 200 and its fluidity is increased at the temperature of bonding. The first confining wall 222 is provided to confine at least one first conductive particle 310 of the adhesive 300 in the first confining groove 221, and the second confining wall 232 is provided to confine at least one second conductive particle 320 of the adhesive 300 in the second confining groove 231.

With reference to FIGS. 1 and 4, in this embodiment, the first height H1 of the first confining wall 222 is not higher than a diameter D1 of the first conductive particle 310, and also the height difference X between the first exposed surface 220a of the first electrode 220 and the second exposed surface 230a of the second electrode 230 is not higher than the diameter D1 of the first conductive particle 310. Preferably, the height difference X is lower than the diameter D1 of the first conductive particle 310.

With reference to FIGS. 1 and 4, in this embodiment, the second height H2 of the second confining wall 232 is not higher than a diameter D2 of the second conductive particle 320 of the adhesive 300.

With reference to FIGS. 1 and 4, the first conductive particle 310 confined in the first confining groove 221 by the first confining wall 222 and the second conductive particle 320 confined in the second confining groove 231 by the second confining wall 232 are unable to flow with the fluid adhesive 300 when bonding the chip 200 to the substrate 100, consequently, the first electrode 220 of the chip 200 is electrically connected to the first bonding pad 110 of the substrate 100 via the first conductive particle 310 in the first confining groove 221 and the second electrode 230 of the chip 200 is electrically connected to the second bonding pad 120 of the substrate 100 via the second conductive particle 320 in the second confining groove 231.

With reference to FIGS. 1, 3 and 4, the resin of the adhesive 300 between the first conductive particle 310 and the first electrode 220 may be squeezed outside the first confining groove 221 via the first gap 222b between the adjacent first ribs 222a when the chip 200 is bonded to the substrate 100 to press the fluid adhesive 300. Identically, the resin of the adhesive 300 between the second conductive particle 320 and the second electrode 230 may be squeezed outside the second confining groove 231 via the second gap 232b between the adjacent second ribs 232a when the chip 200 is bonded to the substrate 100 to press the fluid adhesive 300. For this reason, the resin in the first confining groove 221 and the second confining groove 231 will not stop the bonding of the chip 200 to the substrate 100, and the inclination of the chip 200 is preventable.

Because of the first confining wall 222 of the first electrode 220 and the second confining wall 232 of the second electrode 230, the at least one first conductive particle 310 and the at least one second conductive particle 320 are confined and not moved away from the first electrode 220 and the second electrode 230 with the adhesive 300 when bonding the chip 200 to the substrate 100. The electrical connection between the chip 200 and the substrate 100 is ensured by the at least one first conductive particle 310 confined in the first confining groove 221 and the at least one second conductive particle 320 confined in the second confining groove 231.

While this invention has been particularly illustrated and described in detail with respect to the preferred embodiments thereof, it will be clearly understood by those skilled in the art that is not limited to the specific features shown and described and various modified and changed in form and details may be made without departing from the spirit and scope of this invention.

What is claimed is:

1. A chip package, comprising:
   a substrate;
   a chip including a body and a first electrode, the first electrode is disposed and exposed on a surface of the body and includes a first confining groove and a first confining wall, the first confining wall is peripherally located around the first confining groove and has a first height; and
   an adhesive disposed between the substrate and the chip, at least one first conductive particle of the adhesive is confined in the first confining groove by the first confining wall, wherein the first height of the first confining wall is not higher than a diameter of the at least one first conductive particle, and the first electrode of the chip is electrically connected to a first bonding pad of the substrate by the at least one first conductive particle in the first confining groove.

2. The chip package in accordance with claim 1, wherein the chip further includes a second electrode which is disposed and exposed on the surface of the body, the second electrode includes a second confining groove and a second confining wall which is peripherally located around the second confining groove and has a second height, at least one second conductive particle of the adhesive is confined in the second confining groove by the second confining wall, wherein the second height of the second confining wall is not higher than a diameter of the at least one second conductive particle, and the second electrode of the chip is electrically connected to a second bonding pad of the substrate by the at least one second conductive particle in the second confining groove.

3. The chip package in accordance with claim 2, wherein there is a higher surface area and a lower surface area on the surface, the first and second electrodes are disposed on the higher and lower surface areas, respectively, and wherein a height difference between a first exposed surface of the first electrode and a second exposed surface of the second electrode is not higher than the diameter of the at least one first conductive particle.

4. The chip package in accordance with claim 3, wherein the height difference is lower than the diameter of the at least one first conductive particle.

5. The chip package in accordance with claim 3, wherein the height difference is between 0 and 8 µm.

6. The chip package in accordance with claim 1, wherein the first confining wall is disposed on a first exposed surface of the first electrode.

7. The chip package in accordance with claim 1, wherein the first confining wall includes a plurality of first ribs which are peripherally located around the first confining groove, and there is a first gap between the adjacent first ribs.

8. The chip package in accordance with claim 2, wherein the second confining wall is disposed on a second exposed surface of the second electrode.

9. The chip package in accordance with claim 2, wherein the second confining wall includes a plurality of second ribs which are peripherally located around the second confining groove, and there is a second gap between the adjacent second ribs.

10. A chip, comprising:
   a body; and
   a first electrode disposed and exposed on a surface of the body, the first electrode includes a first confining groove and a first confining wall which is peripherally located around the first confining groove and has a first height, wherein the first confining wall is provided to confine at least one conductive particle of an adhesive in the first confining groove, and the first height of the first confining wall is not higher than a diameter of the at least one conductive particle.

11. The chip in accordance with claim 10 further comprising a second electrode disposed and exposed on the surface, wherein the second electrode includes a second confining groove and a second confining wall which is peripherally located around the second confining groove and has a second height, the second confining wall is provided to confine at least one another conductive particle of the adhesive in the second confining groove, and the second height of the second confining wall is not higher than the diameter of the at least one conductive particle.

12. The chip in accordance with claim 11, wherein there is a higher surface area and a lower surface area on the surface, the first and second electrodes are disposed on the higher and lower surface areas, respectively, and a height difference between a first exposed surface of the first electrode and a second exposed surface of the second electrode is not higher than the diameter of the at least one conductive particle.

13. The chip in accordance with claim 12, wherein the height difference is lower than the diameter of the at least one conductive particle.

14. The chip in accordance with claim 12, wherein the height difference is between 0 and 8 µm.

15. The chip in accordance with claim 10, wherein the first confining wall is disposed on a first exposed surface of the first electrode.

16. The chip in accordance with claim 10, wherein the first confining wall includes a plurality of first ribs which are peripherally located around the first confining groove, and there is a first gap between the adjacent first ribs.

17. The chip in accordance with claim 11, wherein the second confining wall is disposed on a second exposed surface of the second electrode.

18. The chip in accordance with claim 11, wherein the second confining wall includes a plurality of second ribs which are peripherally located around the second confining groove, and there is a second gap between the adjacent second ribs.

19. A chip, comprising:
   a body; and
   a electrode exposed on a surface of the body and including a confining groove and a confining wall, the confining wall is peripherally located around the confining groove and provided to confine at least one conductive particle in the confining groove,
   wherein the confining wall includes a plurality of ribs which are peripherally located around the confining groove, and there is a gap between the adjacent ribs.

* * * * *